United States Patent [19]

Tsuji

[11] Patent Number: 5,901,023
[45] Date of Patent: May 4, 1999

[54] SEMICONDUCTOR INPUT/OUTPUT CIRCUIT

[75] Inventor: Takahiro Tsuji, Osaka, Japan

[73] Assignee: Ricoh Company, Ltd., Tokyo, Japan

[21] Appl. No.: 08/908,532

[22] Filed: Aug. 7, 1997

[30] Foreign Application Priority Data

Aug. 7, 1996 [JP] Japan .................................. 8-223321

[51] Int. Cl.⁶ .................................................. H02H 9/00
[52] U.S. Cl. ............................................. 361/56; 327/565
[58] Field of Search ........................... 361/56, 116, 119, 361/96; 327/379, 384, 530, 535, 564, 565, 603; 326/30, 33, 38, 56, 64, 65, 68, 80, 101, 136; 257/203, 207, 208, 409, 500, 503

[56] References Cited

U.S. PATENT DOCUMENTS 5,453,713   9/1995   Partovi et al. ........................ 327/565

FOREIGN PATENT DOCUMENTS 7-106455   4/1995   Japan ............................. H01L 23/00

*Primary Examiner*—Ronald W. Leja
*Attorney, Agent, or Firm*—Cooper & Dunham LLP

[57] ABSTRACT

A semiconductor input/output (I/O) circuit includes a first protection circuit connecting an analog power supply terminal with a digital power supply line and a digital ground line and a second protection circuit connecting an analog ground terminal with the digital power supply line and the digital ground line. An analog I/O terminal is provided between the analog power supply terminal and the analog ground terminal.

2 Claims, 11 Drawing Sheets

SEMICONDUCTOR INPUT/OUTPUT CIRCUIT

BACKGROUND OF THE INVENTION

1. Field of the Invention

The present invention relates to an Input/Output (I/O) circuit for a CMOS multiple-power-supply integrated circuit, and more particularly to a semiconductor I/O circuit for protecting the integrated circuit. The semiconductor I/O circuit is designed to minimize the circuit scale of the semiconductor circuit as well as to reduce the effects of noise that an analog circuit receives from a digital circuit.

2. Description of the Related Art

In digital semiconductor integrated circuits, protection circuits are typically not provided in the power supply or ground terminals since a general protection circuit is normally arranged between each I/O terminal and an internal circuit corresponding to the power supply and ground. However, in an integrated circuit that operates with plural power supply units (e.g., analog and digital power supply units for supplying power to analog and digital circuitry, respectively), protection circuits are also needed between the I/O terminals (e.g., analog I/O terminals) of one block or group of cells and a power supply or ground (e.g., digital power or ground) of another block or group of cells.

An example of a conventional semiconductor integrated circuit having both analog and digital circuitry (e.g., an analog/digital mixed semiconductor integrated circuit) is shown in FIGS. 3A and 3B. In the I/O circuit shown in FIG. 3A, in order to prevent noise generated by the digital circuitry from interfering with the analog circuitry, the I/O terminals that are connected to power supply lines 16, 18, 20 and GND lines 17, 19, 21 are separated. More specifically, as shown in FIG. 3A, analog power supply line 16, and analog GND line 17 run along and are typically input via a pair of terminals provided along analog I/O terminals 11. Pads 51 are provided in each of the terminals. Digital power supply lines 18 and 20 and digital GND lines 19 and 21 run along and are input via one or more terminals provided along digital I/O terminals 14 and 15, respectively. As shown in FIG. 3A, gaps 25 and 26 are provided between the analog and digital terminals to separate the analog and digital terminals from each other. As shown even more clearly in the layout view depicted in FIG. 3B, typically the analog power terminal and analog ground terminal are arranged between the analog I/O terminals as shown. Gaps 25 and 26 are provided between the analog I/O terminals and the digital I/O terminals 14 and 15, as shown, for isolating the analog and digital terminals from each other.

However, in the I/O circuit shown in FIG. 3, protection circuitry is not provided between the analog circuitry (e.g. power supplied to the analog circuitry) and the digital circuitry (e.g., power supplied to the digital circuitry). Therefore, an Electrostatic Discharge (ESD) event or a "latch up" is likely to occur when an over current or over voltage occurs on an analog I/O terminal. In addition, gaps 25 and 26, necessary for isolating the analog and digital I/O terminals, occupy valuable space on the integrated circuit.

To overcome such problems, attempts have been made at providing circuitry for protecting from ESD events. An example of conventional I/O circuitry used in an analog/digital mixed semiconductor integrated circuit for protecting from ESD events is shown in FIG. 4. In the I/O circuit shown in FIG. 4, resistors 28 and 29 are provided in gaps 25 and 26, respectively. Resistors 28 and 29 connect the analog GND line 17 with the digital GND lines 19 and 21, respectively. The resistors function as protection circuits for preventing the semiconductor integrated circuit from being damaged by an Electrostatic Discharge (ESD) event.

However, although in the circuit shown in FIG. 4 the digital GND lines and the analog GND line are connected with each other via resistors, even in this I/O circuit, damage from an ESD event or a "latch up" is not sufficiently prevented. That is, since there is no protection circuitry provided between the analog circuitry and the digital power supply line or between the digital circuitry and the analog power supply line an ESD event or a "latch up" may still damage the integrated circuitry. Moreover, since the resistors are provided in gaps 25 and 26, an increased area is still required on the semiconductor chip for the I/O circuitry.

Another example of conventional I/O circuitry used in an analog/digital mixed semiconductor integrated circuit is shown in FIGS. 5A and 5B. As shown in FIG. 5A, protection circuits 30 and 31 are provided in gaps 25 and 26, respectively. Protection circuits 30 and 31 are shown more clearly in FIGS. 7B and 7A, respectively.

Protection circuit 31 connects analog power supply line 16 and analog GND line 17 with digital power supply line 20 and digital GND line 21, as shown. Protection circuit 30 connects analog power supply line 16 and analog GND line 17 with digital power supply line 18 and digital GND line 19, as shown. Protection circuits 30 and 31 consist of N-channel MOS transistors 30a, 30b and N-channel MOS transistors 31a, 31b, respectively, as shown. As shown in FIG. 5B, protection circuits 30 and 31 are provided in addition to protection circuits 50a which are typically provided for each I/O terminal.

Using the protection circuitry shown in FIGS. 5 and 7, the power supply can be protected from an over current or over voltage by the use of the protection circuits provided in the I/O circuit. That is, in the I/O circuit shown in FIG. 5, electric current does not flow through the protection circuits even when there is a potential difference between the analog and digital power supply lines.

However, this type of I/O circuit, because of the arrangement of the analog and digital I/O terminals, requires an increased area for the I/O circuitry on the semiconductor substrate since transistors have to be provided between the analog power supply line and the digital power supply lines as well as between the analog GND line and the digital GND lines. That is, as shown clearly in FIG 5B, because of the typical arrangement of the cells, protection circuits are not provided in the analog power cell and the analog ground cell, thus resulting in unused and wasted areas on the semiconductor circuit.

Another example of conventional I/O circuitry is disclosed in Japanese Laid-Open Patent No. 106455/95. Such I/O circuitry is used in an analog/digital mixed semiconductor integrated circuit and is described by reference to FIG. 6. The I/O circuit shown in FIG. 6 is used in a semiconductor integrated circuit driven by three power supply lines 32–34, and is equipped with a protection circuit 36 for preventing the semiconductor integrated circuit from being damaged by an Electrostatic Discharge (ESD) event. The protection circuit 36 consists of N-channel MOS transistors 36a, 36b, 36d connecting power supply lines 32–34, respectively, with a GND line 35, and N-channel MOS transistors 36c, 36e, 36f connecting power supply lines 32–34, with each other.

However, the I/O circuit shown in FIG. 6 requires that a plurality of power supply lines run through the I/O circuit, restricting the effective use of the area of the I/O circuit.

SUMMARY OF THE INVENTION

The present invention has been conceived in light of the above limitations of the prior art, with an object of enabling the provision of adequate protection circuits between analog circuitry and digital circuitry without increasing the area of I/O circuitry. The present invention also reduces the noise that is carried from the digital circuitry to the analog circuitry.

The present invention consists of a semiconductor I/O circuit including a first protection circuit that connects an analog power supply terminal with digital power supply line and digital GND line for protecting the semiconductor integrated circuit from an over current or over voltage. A second protection circuit connects the analog GND terminal with the digital power supply line and digital GND line for also protecting the semiconductor integrated circuit from an over current or over voltage. An analog I/C terminal is provided between the analog power supply terminal and the analog GND terminal. Accordingly, it is possible to provide adequate protection circuitry between the analog circuitry and digital circuitry as well as to reduce the area of semiconductor I/C circuitry on the semiconductor substrate. Also, because there is always an analog power supply terminal or analog GND terminal between the analog I/O terminal and either of the digital input terminals, the analog circuitry is less affected by the noise from the digital circuitry.

According to another aspect of the present invention, a semiconductor input/output (I/O) circuit includes an analog power supply terminal and analog ground terminal for providing power to analog circuitry on a semiconductor and a digital power supply terminal and digital ground terminal for providing power to digital circuitry on the semiconductor via a digital power supply line and a digital ground line, respectively. A first protection circuit connects the analog power supply terminal with the digital power supply line and the digital ground line and a second protection circuit connects the analog ground terminal with the digital power supply line and the digital ground line. An analog I/O terminal is provided between the analog power supply terminal and the power supply terminal and the analog ground terminal. The first and second protection circuits protect the semiconductor from over-current and over-voltage conditions.

BRIEF DESCRIPTION OF THE DRAWINGS

Preferred embodiments of the present invention are described herein below with reference to the accompanying drawings, wherein.

DETAILED DESCRIPTION

Figure 1:
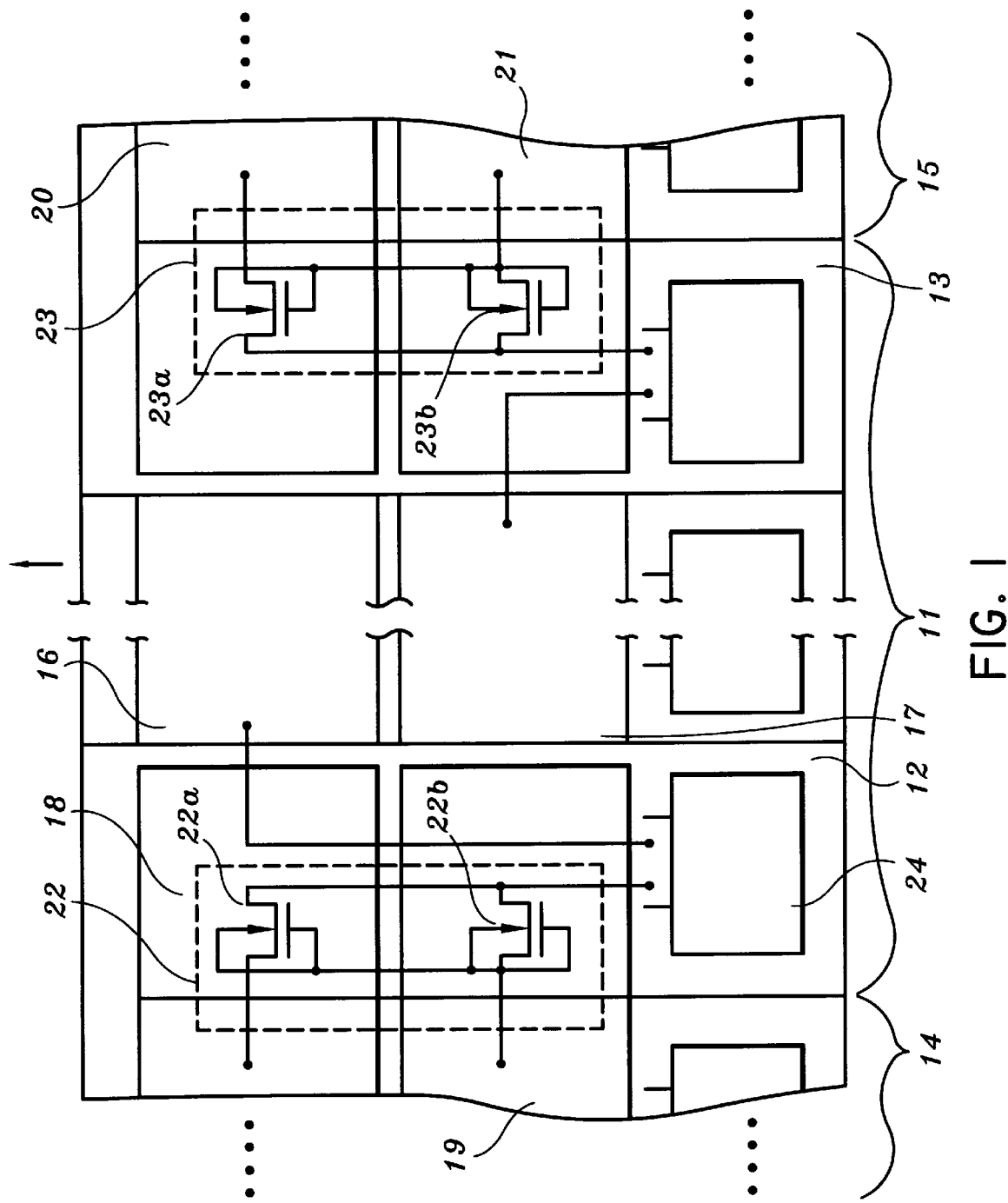
FIG. 1 is a diagram showing a configuration of the semiconductor I/O circuit in accordance with a preferred embodiment of the present invention.

The preferred embodiment of the present invention will now be described in detail with reference to the accompanying drawings in which FIG. 1 is a diagram showing a configuration of a semiconductor I/O circuit in accordance with a preferred embodiment of the present invention.

Figure 8A:
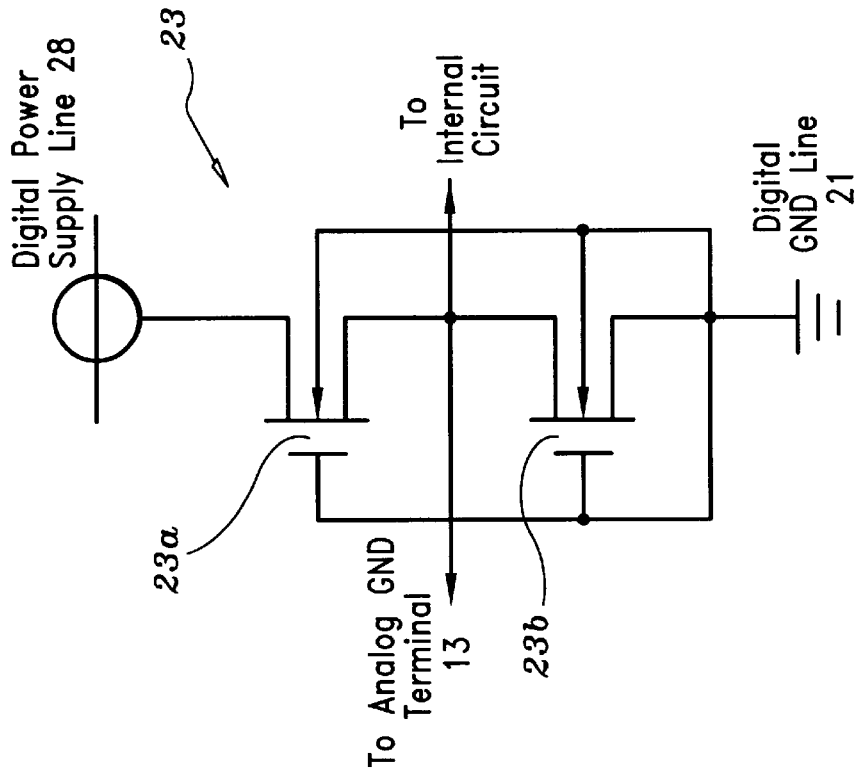
FIGS. 8A and 8B are schematic diagrams showing a configuration of protection circuitry used in the I/O circuit shown in FIGS. 1 and 2.
Figure 8B:
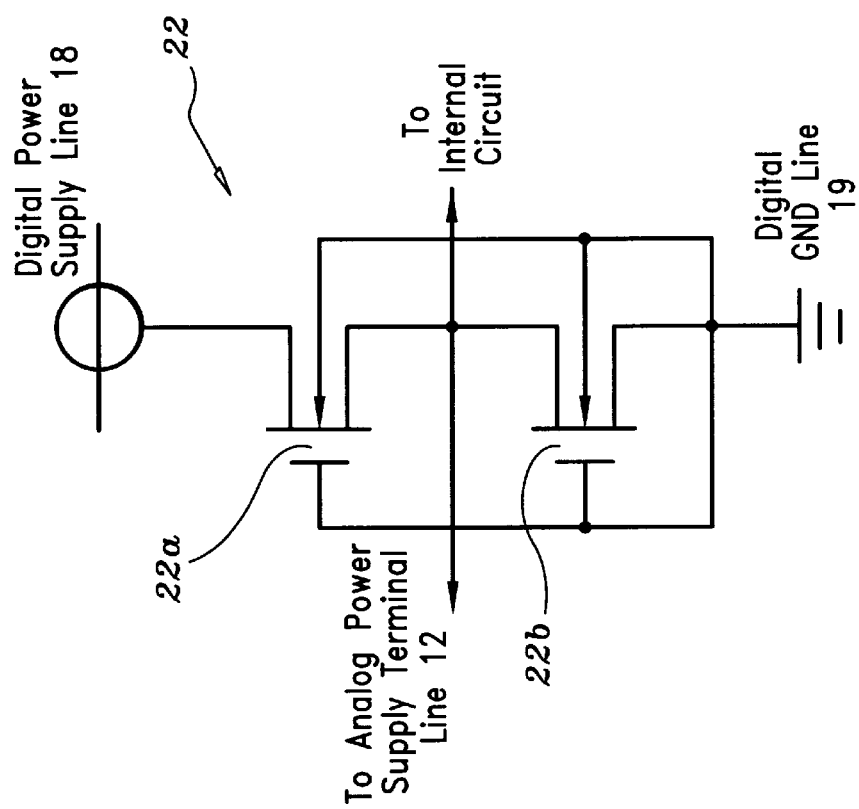

The semiconductor I/O circuit arrangement shown in FIG. 1 is used in semiconductor integrated circuits which include both digital circuitry and analog circuitry. As shown in FIG. 1, protection circuits 22 and 23 are provided. Protection circuits 22 and 23 are shown more clearly in FIGS. 8A and 8B, respectively.

As shown in FIG. 8, the semiconductor I/O circuit includes a first protection circuit 22 that connects an analog power supply terminal 12 and an internal circuit with a digital power supply line 18 and a digital GND line 19. The first protection circuit protects the semiconductor electronic circuitry (not shown) connected thereto from an over current or over voltage. As shown in FIG. 8, the semiconductor I/O circuit also includes a second protection circuit 23 that connects an analog GND terminal 13 and an internal circuit with a digital power supply line 20 and a digital GND line 21, thereby also protecting the semiconductor electronic circuitry (not shown) connected thereto from an over current or over voltage.

Figure 2A:
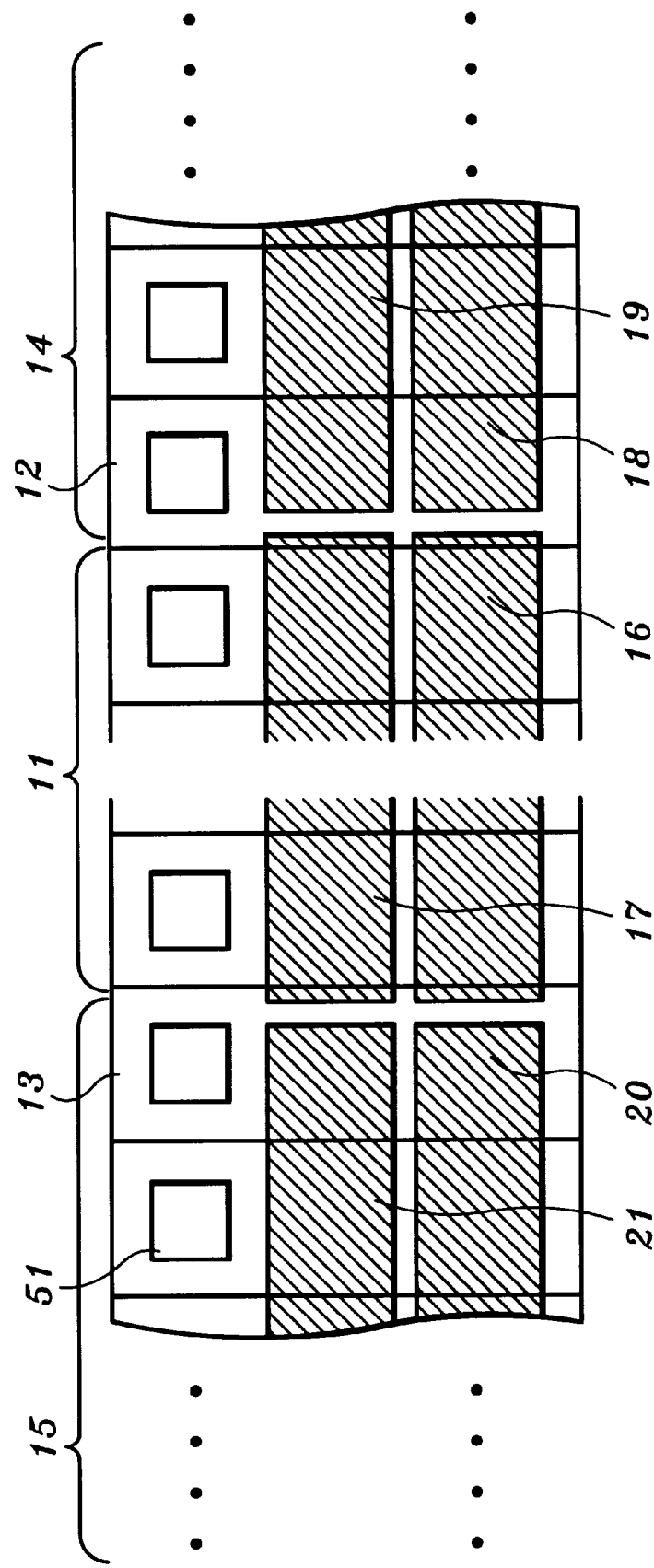
FIGS. 2A and 2B are diagrams showing a configuration of the semiconductor I/O circuit in accordance with the preferred embodiment of the present invention.
Figure 2B:
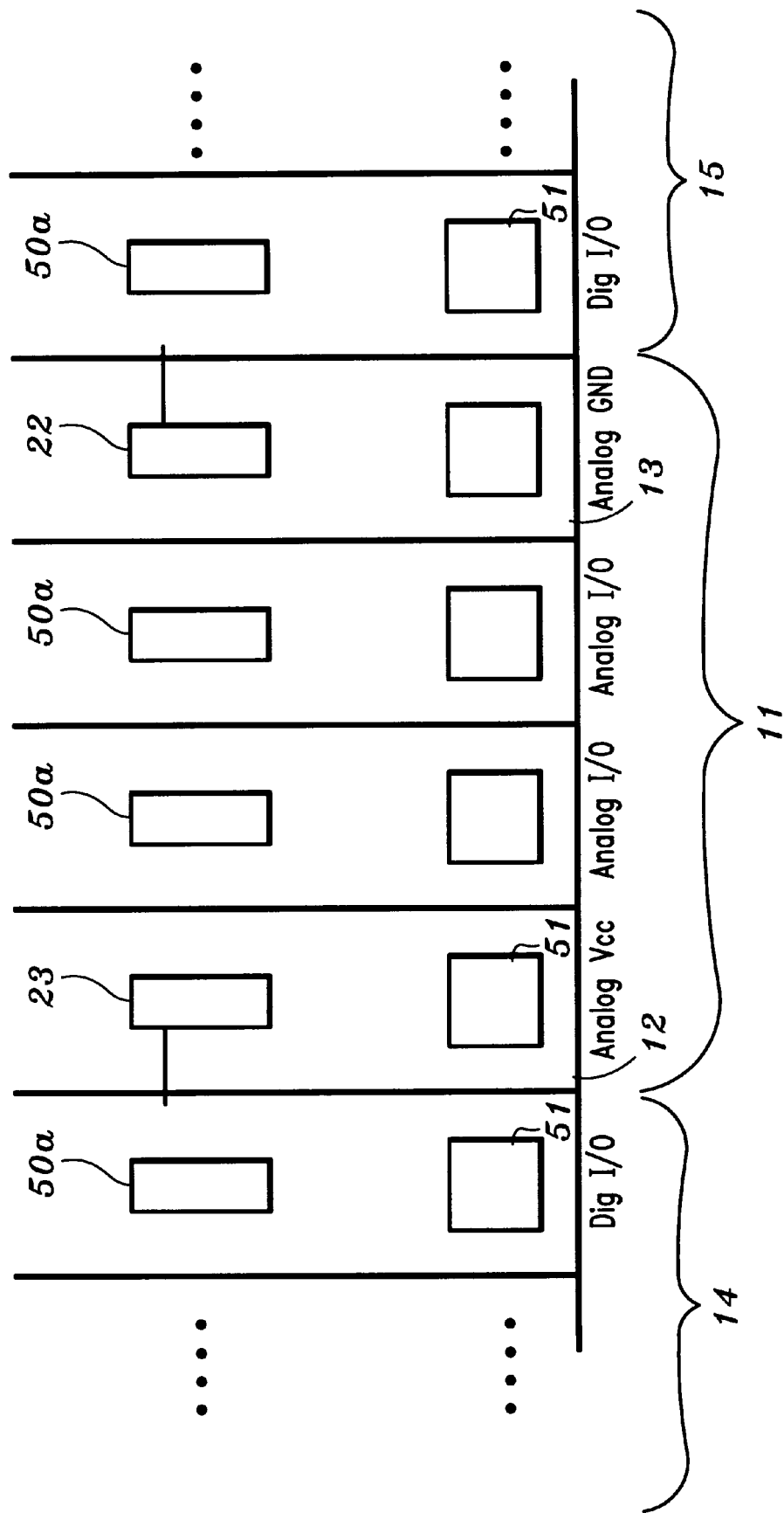

As depicted in FIGS. 2A and 2B each cell includes a terminal pad 51. The analog I/O terminals are located between the analog power supply terminal 12 and the analog GND terminal 13, as shown. Providing the analog I/O terminals between the analog power supply terminal 12 and the analog GND terminal 13 separates the analog I/O terminals from the digital I/O terminals and effectively isolates the analog I/O signals for the analog circuitry from the I/O signals for the digital circuitry. This helps minimize the amount of noise picked up by the analog circuitry from the digital circuitry.

Figure 7B:
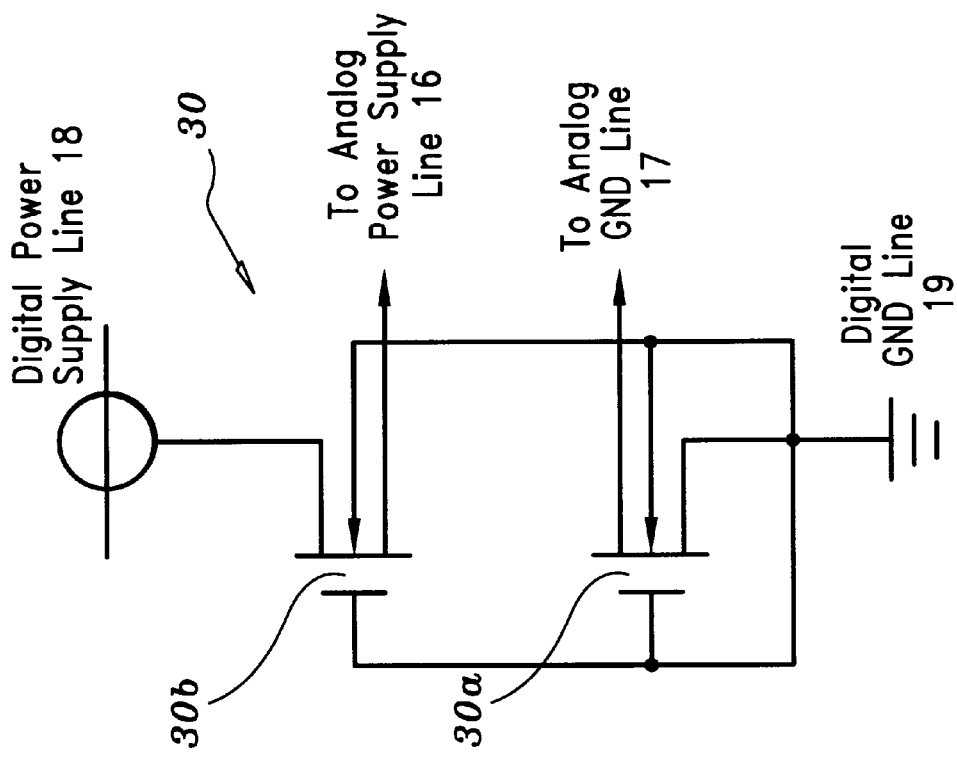
FIGS. 7A and 7B are schematic diagrams showing a configuration of protection circuitry used in the I/O circuit shown in FIG. 5A.
Figure 7A:
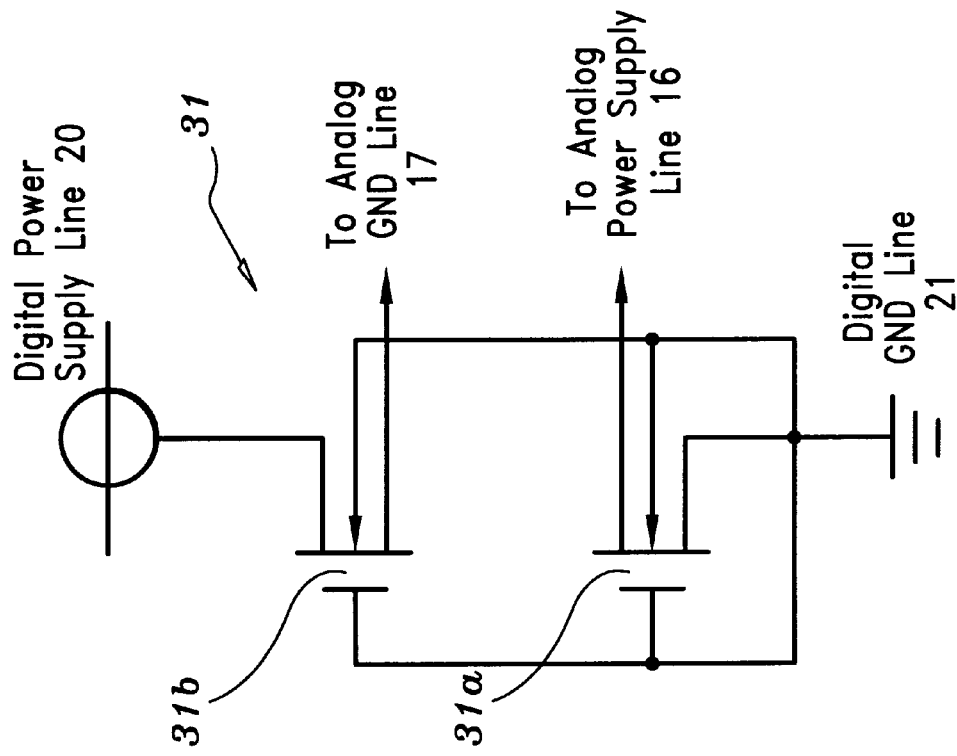

Returning to FIGS. 8A and 8B, the first protection circuit 22 consists of two N-channel MOS transistors 22a and 22b. Likewise, the second protection circuit 23 consists of two N-channel MOS transistors 23a and 23b. The first and second protection circuits 22 and 23 are similar to those shown in FIG. 7 and described above with reference to the background art. However, the protection circuits according to the present invention are connected and arranged in a much more efficient and much more effective manner than in the background art, minimizing the required space required for the I/O circuitry and, as noted above, minimizing the amount of noise on the analog and digital circuitry.

According to the semiconductor I/O circuit shown in FIGS. 1 and 2B, the analog I/O terminals are provided between analog power supply terminal 12 and analog GND terminal 13. This arrangement allows protection circuits 22 and 23 to be provided in the analog ground and analog power cells, respectively, thus protecting the analog circuitry and digital circuitry while minimizing the amount of space necessary. Protection circuits 22 and 23 are thus able to prevent problems caused by breakdown or latch-up of the semiconductor integrated circuit caused by Electrostatic Discharge (ESD) events while minimizing the amount of space required on the semiconductor chip for the I/O circuitry. That is, because of the arrangement of the analog terminals, the analog I/O terminals can be effectively isolated from the digital I/O terminals without requiring any wasted space between the analog and digital I/O terminals. In addition, because of this arrangement of the terminals, the protection circuitry can be provided on the analog power and ground cells which, as described above in the background of the invention, were previously unused wasted areas not provided with any protection circuitry. Accordingly, the protection circuitry arrangement of the present invention does not require an increased area on the semiconductor substrate.

The analog power supply terminal 12 and analog GND terminal 13 are provided between the analog I/O terminal 11 and the digital I/O terminals 14 and 15 as shown in FIG. 1 and absorb any noise which may tend to propagate from the digital I/O terminals. The analog circuitry is thus isolated from and therefor less affected by noise from the digital circuitry.

Figure 3A:
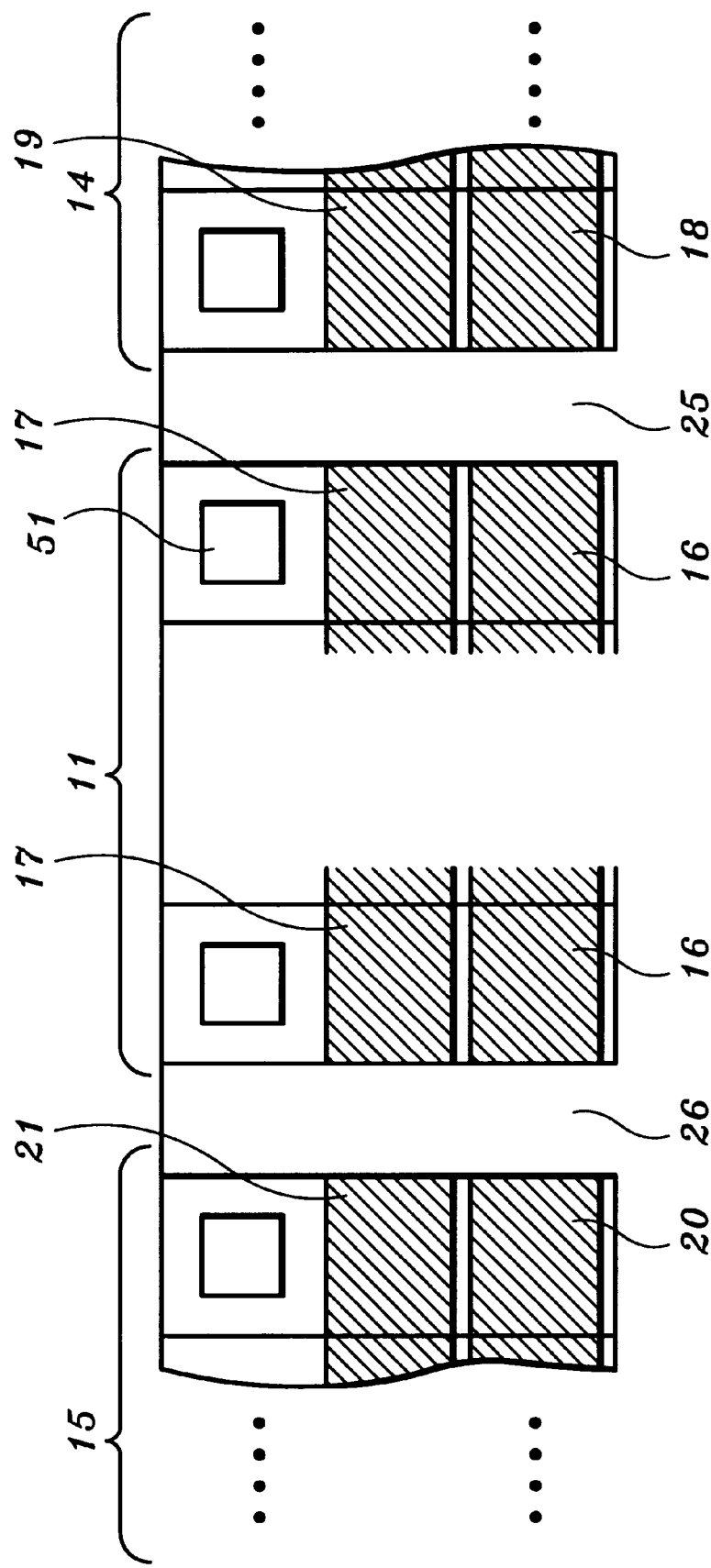
FIGS. 3A and 3B are diagrams showing a configuration of a conventional analog/digital mixed semiconductor integrated circuit.
Figure 3B:
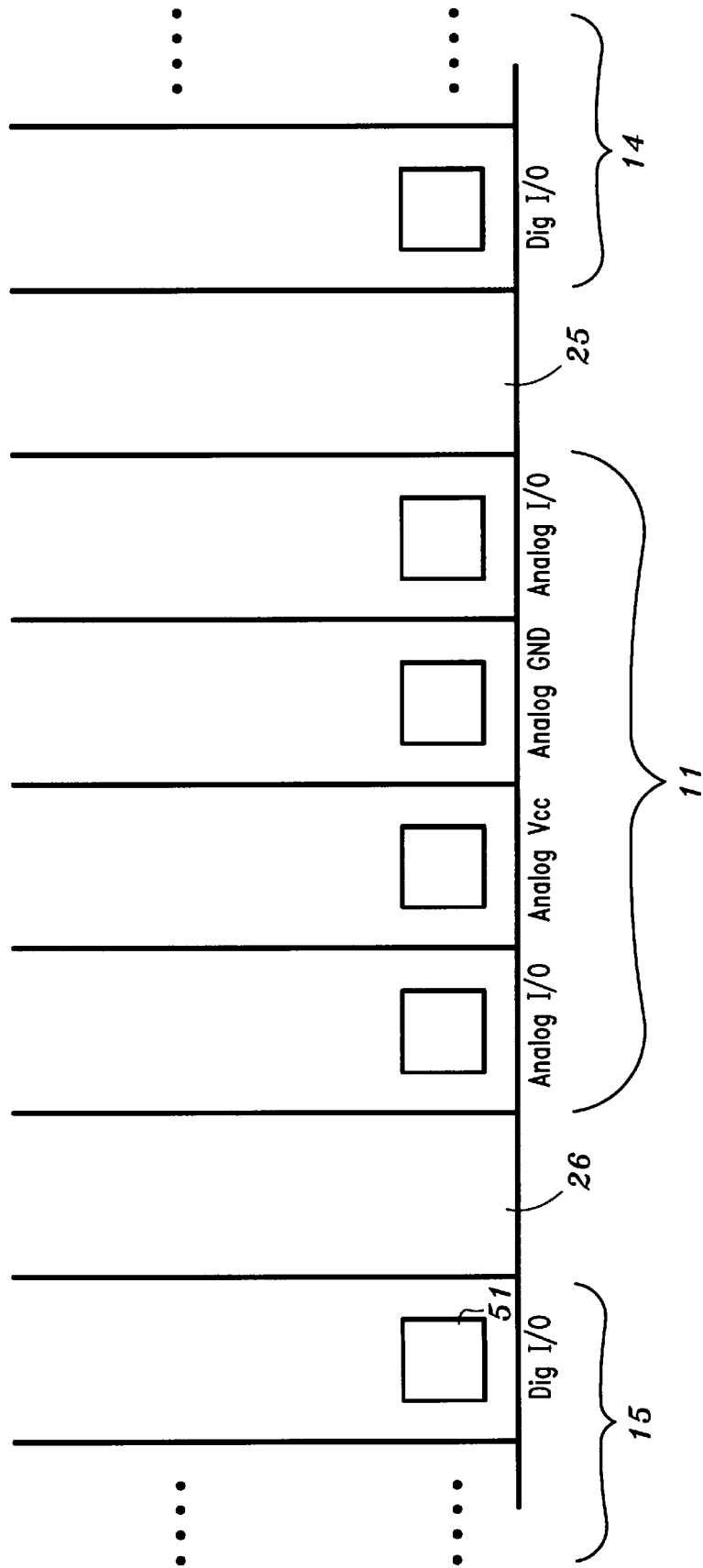
Figure 4:
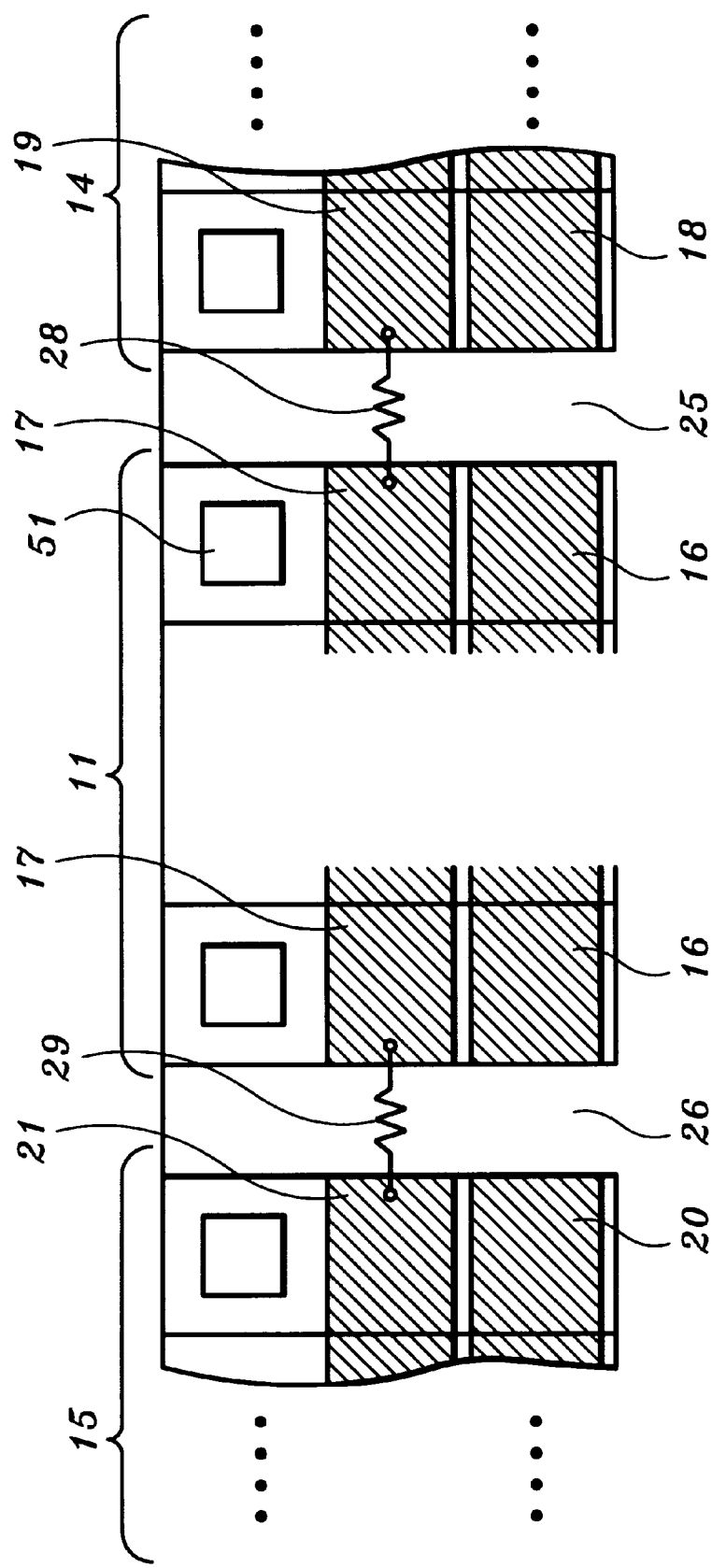
FIG. 4 is a diagram showing another configuration of conventional I/O circuitry used in an analog/digital mixed semiconductor integrated circuit.
Figure 5A:
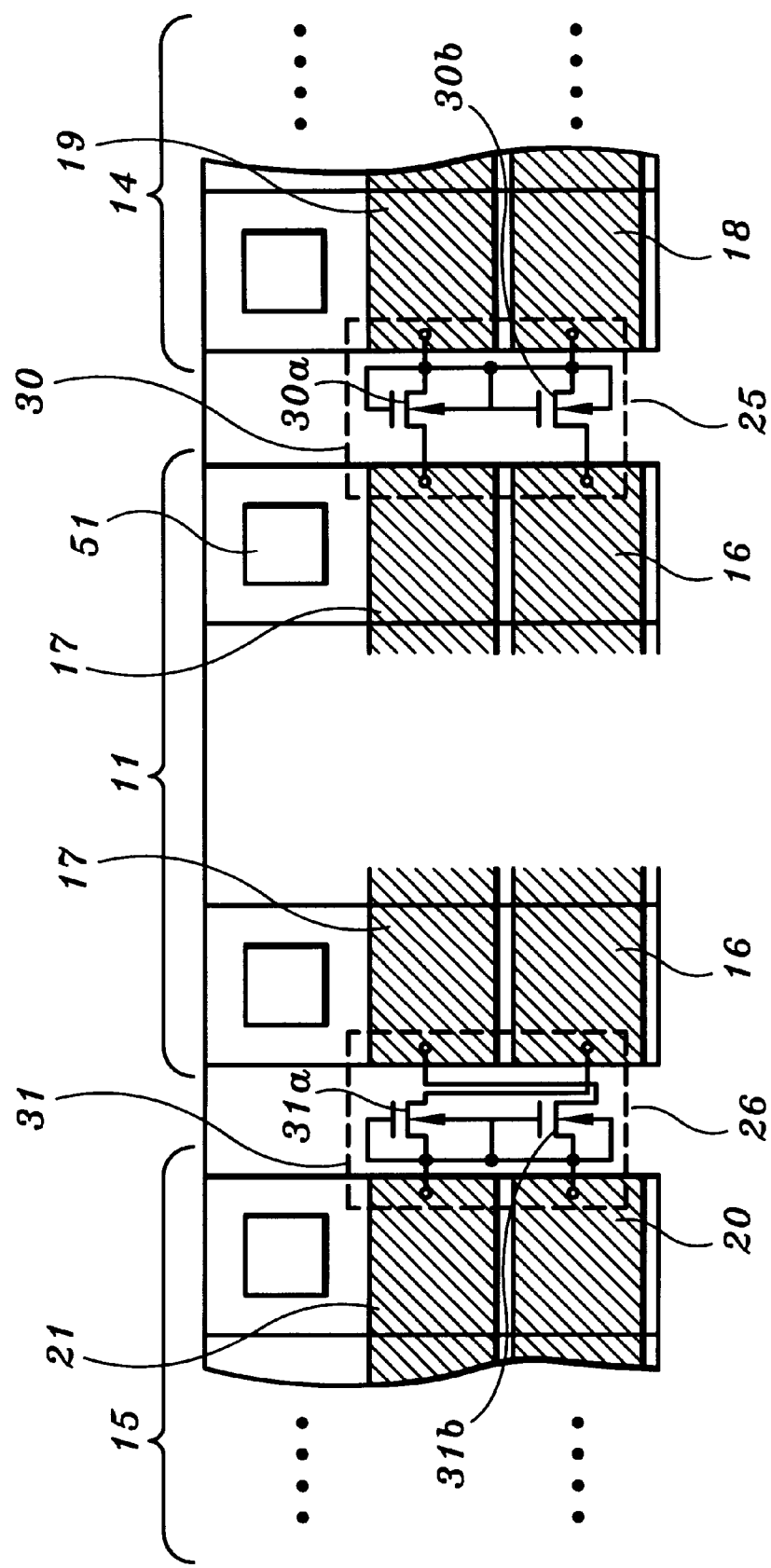
FIGS. 5A and 5B are diagrams showing still another configuration of another example of conventional I/O circuitry used in an analog/digital mixed semiconductor integrated circuit.
Figure 5B:
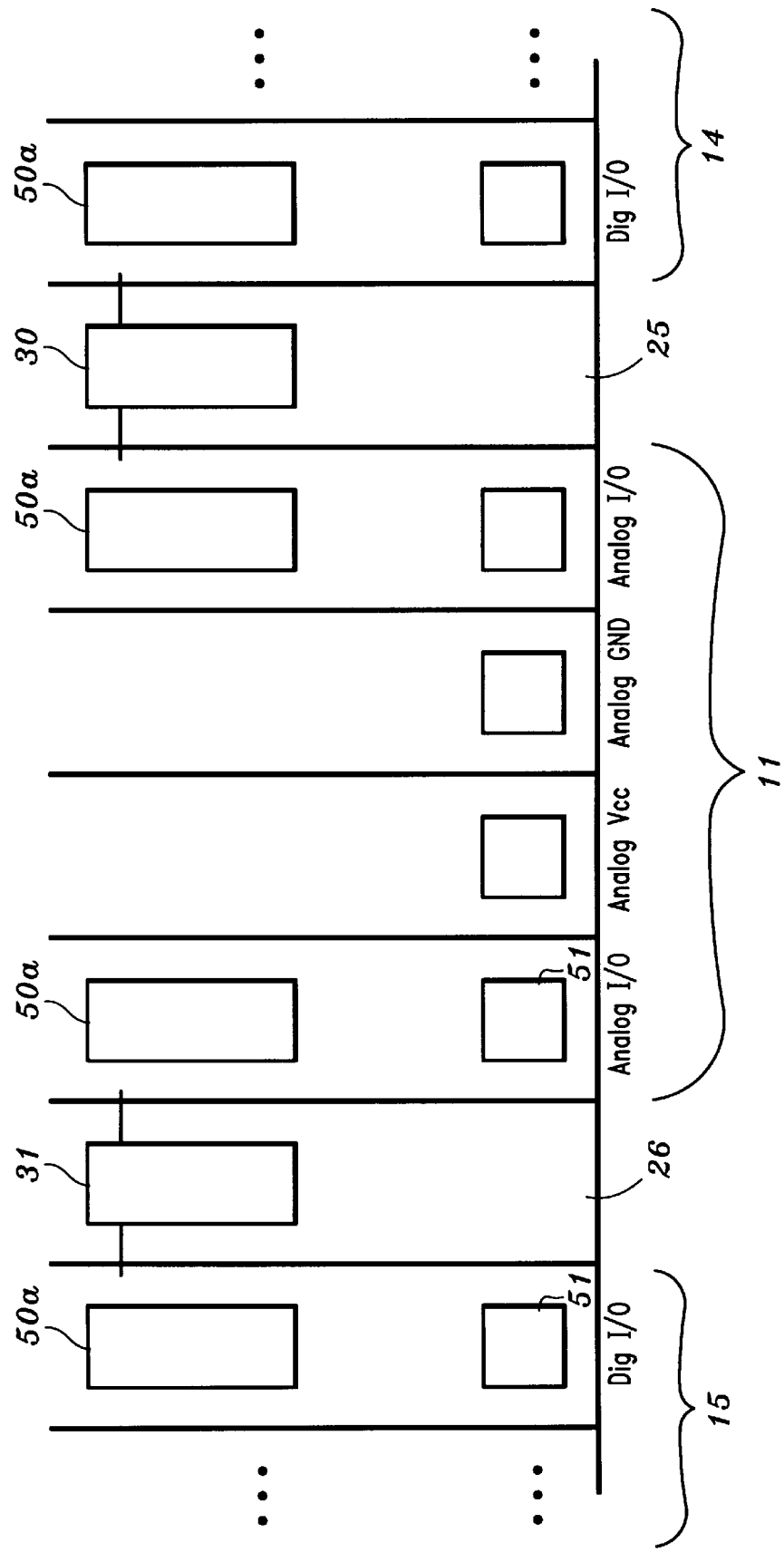
Figure 6:
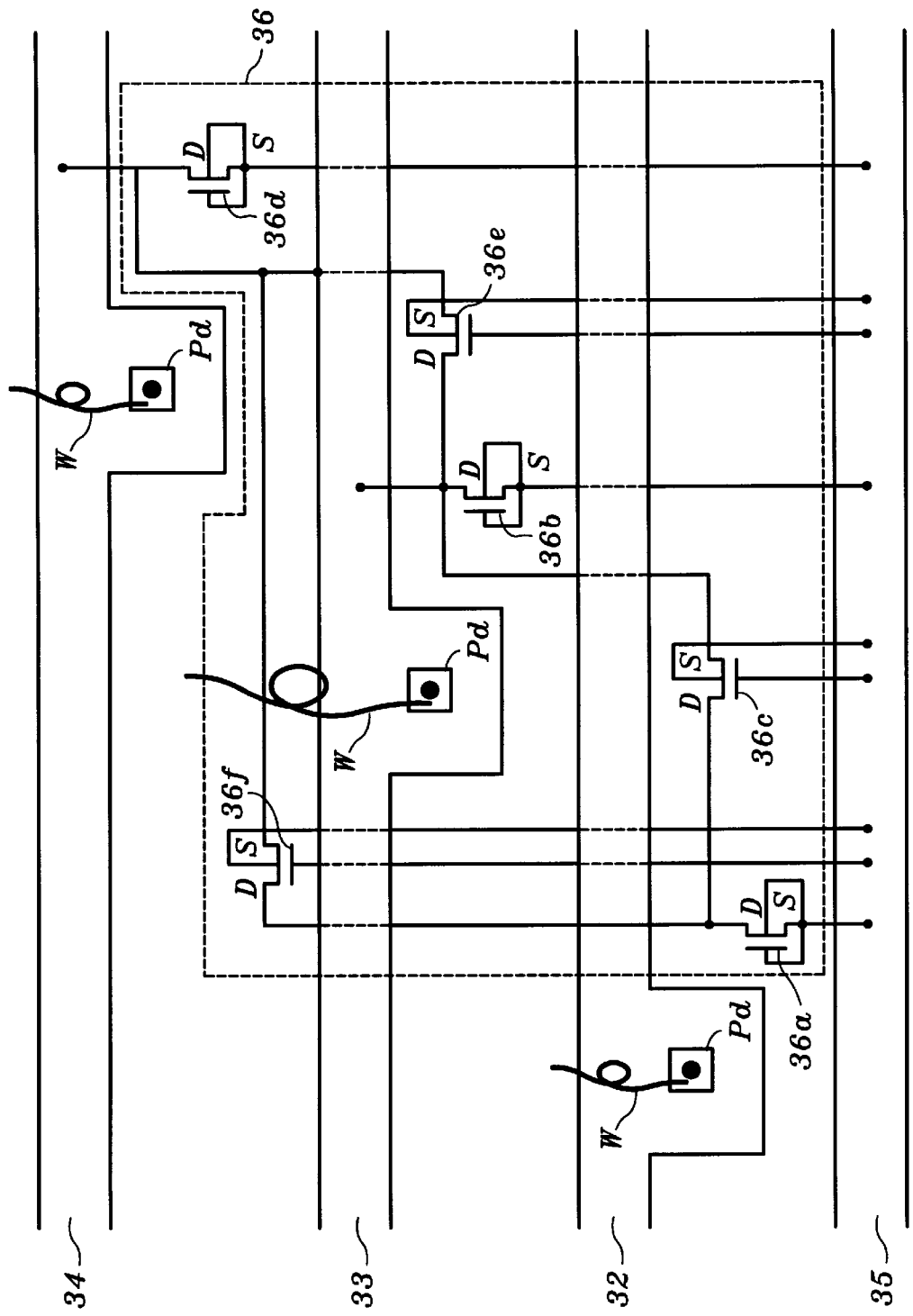
FIG. 6 is a block diagram showing yet another configuration of a fourth example of conventional I/O circuitry used in an analog/digital mixed semiconductor integrated circuit.

FIG. 2A is a drawing of the preferred embodiment of the present invention redrawn in the same style as that shown in FIGS. 3A, 4 and 5A for comparison purposes. As noted above, FIGS. 3–6 show semiconductor I/O circuits in accordance with the background art. As is evident from a comparison of FIGS. 2A and 5A, for example, according to the semiconductor I/O circuit of the preferred embodiment of the present invention, gaps 25 and 26 which were necessary for the semiconductor circuitry in accordance with the background art can be eliminated, while still providing the necessary protection circuitry and still providing isolation between the analog and digital I/O terminals. That is, the area on the semiconductor chip required for the I/O circuitry can be reduced without sacrificing the benefits obtained by the presence of the protection circuits 22 and 23.

Additional modifications and variations of the present invention are possible in light of the above teachings. It is therefore to be understood that within the scope of the amended claims, the invention may be practiced otherwise than as specifically described herein.

What is claimed is:

1. A semiconductor input/output (I/O) circuit, comprising:

a first protection circuit provided in an analog power cell for connecting an analog power supply terminal with at least one of a plurality of digital power supply lines and at least one of a plurality of digital ground lines; and a second protection circuit provided in an analog ground cell for connecting an analog ground terminal with another of the plurality of digital power supply lines and another of the digital ground lines, wherein an analog I/O terminal is provided between the analog power supply terminal and the analog ground terminal.

2. A semiconductor input/output (I/O) circuit, comprising:

an analog power supply terminal and analog ground terminal for providing power to analog circuitry on a semiconductor;

at least one digital power supply line and at least one digital ground line for providing power to digital circuitry on the semiconductor via a digital power supply;

a first protection circuit provided in an analog power cell for connecting the analog power supply terminal with at least one of the at least one digital power supply line and at least one of the at least one digital ground line; and a second protection circuit provided in an analog ground cell for connecting the analog ground terminal with another of the at least one digital power supply line and another of the at least one digital ground line, wherein an analog I/O terminal is provided between the analog power supply terminal and the analog ground terminal, the first and second protection circuits protecting the semiconductor from over-current and over-voltage conditions.

* * * * *